(12) United States Patent
Han et al.

(10) Patent No.: US 12,021,453 B2
(45) Date of Patent: Jun. 25, 2024

(54) POWER SUPPLY SYSTEM AND ICT DEVICE

(71) Applicant: Huawei Digital Power Technologies Co., Ltd., Shenzhen (CN)

(72) Inventors: Junwei Han, Shanghai (CN); Zhongshu Zhang, Chengdu (CN); Lei Zan, Dongguan (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 0 days.

(21) Appl. No.: 18/148,055

(22) Filed: Dec. 29, 2022

(65) Prior Publication Data

US 2023/0140489 A1 May 4, 2023

Related U.S. Application Data

(63) Continuation of application No. PCT/CN2020/099575, filed on Jun. 30, 2020.

(51) Int. Cl.
*H05K 7/20* (2006.01)
*H02M 3/158* (2006.01)

(52) U.S. Cl.
CPC ........... *H02M 3/158* (2013.01); *H05K 7/209* (2013.01)

(58) Field of Classification Search
CPC .......... H02M 3/158; H05K 7/209; H05K 7/20
See application file for complete search history.

(56) References Cited

U.S. PATENT DOCUMENTS 9,851,770 B1 * 12/2017 Zhang ................. G06F 1/263
2019/0372344 A1  12/2019 Yew Lam et al.

FOREIGN PATENT DOCUMENTS

| CN | 109219320 A | 1/2019 |
| JP | 2007037219 A | 2/2007 |
| JP | 2011010523 A | 1/2011 |
| JP | 2013062540 A | 4/2013 |
| WO | 2013046416 A1 | 4/2013 |

OTHER PUBLICATIONS

Tanaka et al., "Concept of New Power Supply System Topology Using 380 V and 48 V DC Bus for Future Datacenters and Telecommunication Buildings", IEEE International Telecommunications Energy Conference (INTELEC), 2015, 6 pages.

* cited by examiner

*Primary Examiner* — Robert L Deberadinis
(74) *Attorney, Agent, or Firm* — Maier & Maier, PLLC

(57) ABSTRACT

The power supply system includes a first voltage conversion unit, where the first voltage conversion unit is an isolated voltage conversion unit, and the first voltage conversion unit is connected to a power supply, and is configured to convert a voltage of the power supply into a power supply voltage of the service board, that is, a first voltage; and a second voltage conversion unit, where the second voltage conversion unit is a non-isolated voltage conversion unit, the second voltage conversion unit is deployed on the service board, and the second voltage conversion unit is configured to convert the first voltage into a power supply voltage of a first load module on the service board, that is, a second voltage.

11 Claims, 8 Drawing Sheets

POWER SUPPLY SYSTEM AND ICT DEVICE

CROSS-REFERENCE TO RELATED APPLICATIONS

This application is a continuation of International Application No. PCT/CN2020/099575, filed on Jun. 30, 2020, the disclosure of which is hereby incorporated by reference in its entirety.

TECHNICAL FIELD

The embodiments relate to the power supply field, a power supply system, and an information and communications technology (ICT) device.

BACKGROUND

With continuous development of an ICT, a wider bandwidth, a faster data transfer rate, and a shorter delay drive a power capacity of an ICT device to increase continuously. Therefore, in various ICT devices, a more severe challenge is posed to power supply efficiency, heat dissipation, and energy consumption of a circuit system.

Therefore, how to efficiently supply power to a service board in the ICT device is a problem that needs to be resolved as soon as possible.

SUMMARY

This embodiments provide a power supply system, to improve power supply efficiency of supplying power to a service board (or a circuit board, a processing board, a main board, or the like) in an ICT device by a power supply.

The embodiments include the following solutions:

According to a first aspect, the embodiments provide a power supply system. The power supply system is configured to supply power to at least one load module on a service board. The power supply system includes a first voltage conversion unit and a second voltage conversion unit. The first voltage conversion unit is an isolated voltage conversion unit, the first voltage conversion unit is connected to a power supply and is configured to convert a voltage of the power supply into a first voltage, and the first voltage is a power supply voltage of the service board. The second voltage conversion unit is a non-isolated voltage conversion unit, and the second voltage conversion unit is deployed on the service board. The second voltage conversion unit is connected to the first voltage conversion unit and is configured to convert the first voltage into a second voltage, and the second voltage is a power supply voltage of a first load module on the service board.

In the power supply system provided in the embodiments, a non-isolated voltage conversion unit is used for each on-board power supply on the service board, to improve voltage conversion efficiency of the on-board power supply. Further, because a circuit of a non-isolated on-board power supply has a low height, whole-board heat dissipation may be performed for the on-board power supply and the load module on the service board, to improve heat dissipation efficiency of the service board.

the second voltage conversion unit may include a field effect transistor and a capacitor. In this possible implementation, the second voltage conversion unit implements non-isolated voltage step-down, and voltage conversion efficiency is improved.

The first voltage may be greater than 12 V.

The first load module may be an optical module.

The power supply system may further include a third voltage conversion unit and a fourth voltage conversion unit. The third voltage conversion unit is a non-isolated voltage conversion unit, the third voltage conversion unit is deployed on the service board, and the third voltage conversion unit is connected to the first voltage conversion unit and is configured to convert the first voltage into a third voltage. The fourth voltage conversion unit is a non-isolated voltage conversion unit, the fourth voltage conversion unit is deployed on the service board, the fourth voltage conversion unit is connected to the third voltage conversion unit and is configured to convert the third voltage into a fourth voltage, and the fourth voltage is a power supply voltage of a second load module on the service board.

A power of the second load module may be less than or equal to a preset threshold.

The second load module may be a low-power load.

An on-board power supply of a two-stage conversion type including the third voltage conversion unit and the fourth voltage conversion unit supplies power to a load module, to reduce a voltage difference between an input voltage and an output voltage of the third voltage conversion unit and reduce a voltage difference of the fourth voltage conversion unit. Therefore, a requirement for a parameter of a circuit element in the on-board power supply can be reduced, and costs (if the requirement for the parameter of the circuit element is high, production costs are high) are reduced. The parameter of the circuit element may be, for example, an input voltage, an output voltage, or the like of the circuit element.

A whole-board heat sink may dissipate heat of the second voltage conversion unit and the first load module and may cover the second voltage conversion unit and the first load module.

The whole-board heat sink dissipates heat of the second voltage conversion unit and a load module, so that a distance between the second voltage conversion unit and the load module can be effectively reduced, to reduce a line loss, and improve power supply efficiency of supplying power to the load module by the power supply system.

A value range of the first voltage may include 24 V to 60 V.

A value of the first voltage may be 48 V or 53.5 V.

According to a second aspect, the embodiments may further provide an ICT device. The ICT device includes the power supply system provided in any one of the first aspect and the possible implementations of the first aspect. The power supply system is configured to supply power to a service board in the ICT device.

For an implementation of the power supply system included in the ICT device provided in the second aspect, refer to the descriptions of the first aspect and the implementations of the first aspect. For beneficial effects that can be achieved by the power supply system included in the ICT device provided in the second aspect, refer to beneficial effects of the first aspect and various implementations of the first aspect. Details are not described herein again.

A name of the power supply system does not constitute a limitation on a device or a functional module. In an actual implementation, the device or the functional module may be represented by another name. Each device or functional module falls within the scope of the embodiments and their equivalent technologies, provided that a function of the device or functional module is similar.

These aspects or other aspects are more concise and comprehensible in the following descriptions.

DETAILED DESCRIPTION OF THE EMBODIMENTS

In embodiments, the word "example", "for example", or the like is used to represent giving an example, an illustration, or a description. Any embodiment described as an "example" or "for example" should not be explained as being more preferred or having more advantages than another embodiment. Use of the word "example", "for example", or the like is intended to present a related concept.

The terms "first" and "second" in the embodiments are merely intended for a purpose of description and shall not be understood as an indication or implication of relative importance or implicit indication of a quantity of indicated features. Therefore, a feature limited by "first" or "second" may explicitly indicate or implicitly include one or more such features. In the descriptions, unless otherwise stated, "a plurality of" means two or more than two.

"At least one" means one or more, and "a plurality of" means two or more. For example, a plurality of second packets means two or more second packets. In the embodiments, the terms "system" and "network" may be used interchangeably.

The terms used in the descriptions of various examples in the embodiments are only intended to describe particular examples and are not intended to constitute a limitation. Singular forms "one ("a" and "an")" and "this" are also intended to include a plural form, unless otherwise specified in the context clearly.

The term "and/or" indicates and includes any or all possible combinations of one or more items in associated listed items. The term "and/or" describes only an association relationship for describing associated objects and represents that three relationships may exist. For example, A and/or B may represent the following three cases: only A exists, both A and B exist, and only B exists. In addition, the character "/" generally indicates an "or" relationship between the associated objects.

The term "include" (also referred to as "includes", "including", "comprises", and/or "comprising") specifies existence of features, integers, steps, operations, elements, and/or components, without excluding existence or addition of one or more other features, integers, steps, operations, elements, components, and/or their combinations.

With continuous development of an ICT technology, ICT devices with different functions and uses emerges accordingly. The ICT device includes a service board for implementing various service functions.

An embodiment may provide a power supply system. The power supply system can improve efficiency of supplying power to a service board in an ICT device by a power supply.

Further, because a circuit part deployed on the service board in the power supply system has a small size and a low height, space utilization of the service board is improved. In other words, a capacity of the service board is effectively increased. Therefore, the power supply system can meet an evolution requirement of a large-capacity service board.

Figure 1:
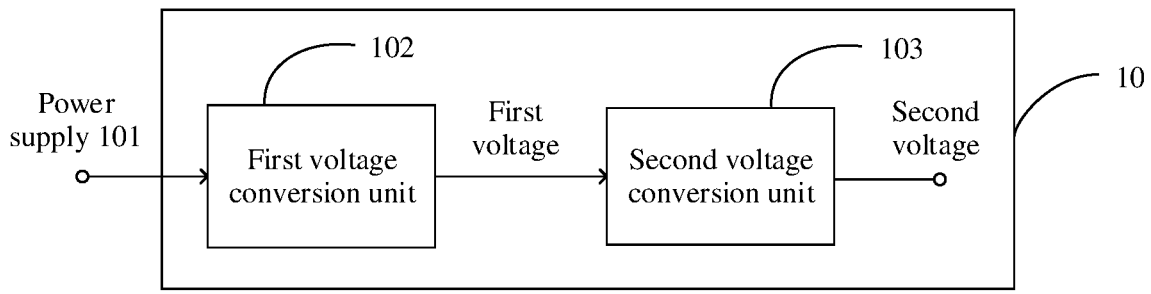
FIG. 1 is a schematic diagram 1 of a power supply system according to an embodiment.

FIG. 1 shows a power supply system 10 according to an embodiment. The power supply system 10 is configured to supply power to at least one service board in an ICT device. One service board may include at least one load module. As shown in FIG. 1, the power supply system 10 is externally connected to a power supply 101, and the power supply system 10 includes a first voltage conversion unit 102 and a second voltage conversion unit 103. An arrow direction shown in FIG. 1 indicates a current flow direction.

The power supply 101 may be a power supply of an equipment room in which the ICT device is located. Optionally, the power supply 101 may be at least one of an alternating current (alternating current, AC) power supply, a high voltage direct current (high voltage direct current, HVDC) power supply, or a low voltage direct current (low voltage direct current, LVDC) power supply. In an example, a voltage range of the AC power supply may be 100 Vac to 240 Vac, a voltage range of the HVDC power supply may be 240 Vdc to 480 Vdc, and a voltage range of the LVDC power supply may be 40 Vdc to 70 Vdc.

The first voltage conversion unit 102 is an isolated voltage conversion unit. The first voltage conversion unit 102 may implement isolated voltage conversion by using a magnetically isolated transformer device. For example, the first voltage conversion unit 102 may be a wire wound transformer.

The first voltage conversion unit 102 may be connected to the power supply 101 and may be configured to convert a voltage of the power supply 101 into a first voltage. The first voltage is a bus voltage used to supply power to the service board. In this embodiment, the first voltage may be a voltage greater than 12 V.

When the power supply 101 is an AC power supply or an HVDC power supply, the first voltage may be less than the voltage of the power supply 101. When the power supply 101 is an LVDC power supply, the first voltage may be less than the voltage of the power supply 101 or may be greater than the voltage of the power supply 101. This is not limited.

For example, a value range of the first voltage may be 24 V to 60 V and is not limited thereto.

In an example, the first voltage may be a common voltage of 48 V or a common voltage of 53.5 V. The first voltage may also be a voltage of 61 V.

In an actual application, the first voltage conversion unit 102 may be a power supply unit (PSU) of the ICT device, to provide a bus voltage (namely, the first voltage) for the service board. One ICT device may include at least one PSU. In other words, one ICT device may include at least one first voltage conversion unit 102.

The first voltage conversion unit 102 may be a direct current-direct current (DC-DC) voltage conversion circuit. In other words, an input voltage of the first voltage conversion unit 102 is a direct current voltage, and the output first voltage is also a direct current voltage.

Figure 2:
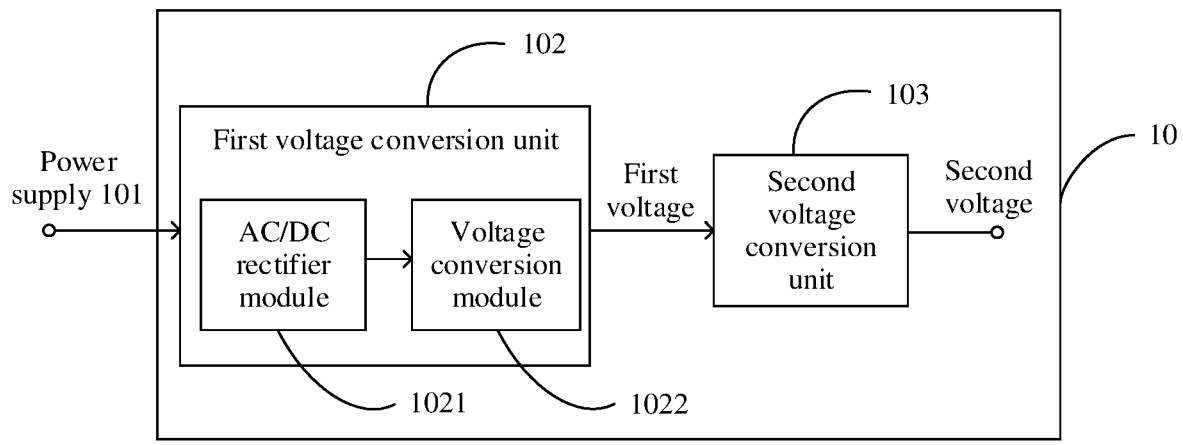
FIG. 2 is a schematic diagram 2 of a power supply system according to an embodiment.

Optionally, if the power supply 101 is an AC power supply, as shown in FIG. 2, the first voltage conversion unit 102 includes an AC/DC rectifier module 1021 and a voltage conversion module 1022. The AC/DC rectifier module 1021 is connected to the power supply 101 and is configured to convert an alternating current of the power supply 101 into a direct current. The AC/DC rectifier module 1021 is further connected to the voltage conversion module 1022. In this case, the voltage conversion module 1022 may convert, into the first voltage, the direct current voltage output by the AC/DC rectifier module 1021 through rectification.

The voltage conversion module 1022 is an isolated voltage conversion module, and the voltage conversion module 1022 may implement isolated voltage conversion by using a magnetically isolated transformer device. For example, the voltage conversion module 1022 may be a wire wound transformer.

An arrow direction shown in FIG. 2 indicates a current flow direction.

As shown in FIG. 1, the second voltage conversion unit 103 is a non-isolated voltage conversion unit. The second voltage conversion unit 103 may implement non-isolated voltage conversion by using a non-isolated circuit including a switching device and a capacitor device. The second voltage conversion unit 103 is deployed on the service board.

The second voltage conversion unit 103 may be connected to the first voltage conversion unit 102 and may be configured to convert, into a second voltage, the first voltage output by the first voltage conversion unit 102. The second voltage is a voltage used to supply power to a first load module on the service board. Herein, the first load module is any one of the at least one load module on the service board.

For example, the first load module may usually be an optical module on the service board.

Optionally, the second voltage is usually less than the first voltage. In other words, the second voltage conversion unit 103 is a circuit unit for voltage step-down.

Figure 3:
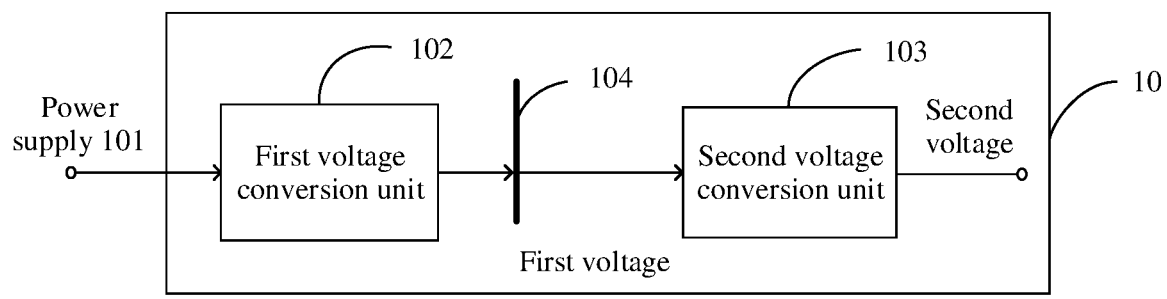
FIG. 3 is a schematic diagram 3 of a power supply system according to an embodiment.

In an actual application, the second voltage conversion unit 103 may be connected to the first voltage conversion unit 102 by using a backplane. As shown in FIG. 3, the first voltage conversion unit 102 is connected to a backplane 104, and outputs the output first voltage to the backplane 104. The second voltage conversion unit 103 is connected to the backplane 104 and may obtain the first voltage from the backplane 104, and then convert the first voltage into a power supply voltage (namely, the second voltage) required by the first load module on the service board.

If there are m first conversion units 102, there are n second voltage conversion units 103. Herein, m and n each are an integer greater than 1. The n second voltage conversion units 103 may be n second voltage conversion units 103 deployed on a same service board or may be n second voltage conversion units 103 deployed on a plurality of service boards. This is not limited. In this case, the backplane 104 may be configured to equally supply, to the n second voltage conversion units 103, m first voltages output by m first conversion units 102, to equally supply power to the load module. The backplane 104 may alternatively unequally supply power to a plurality of load modules. This is not limited.

Figure 4:
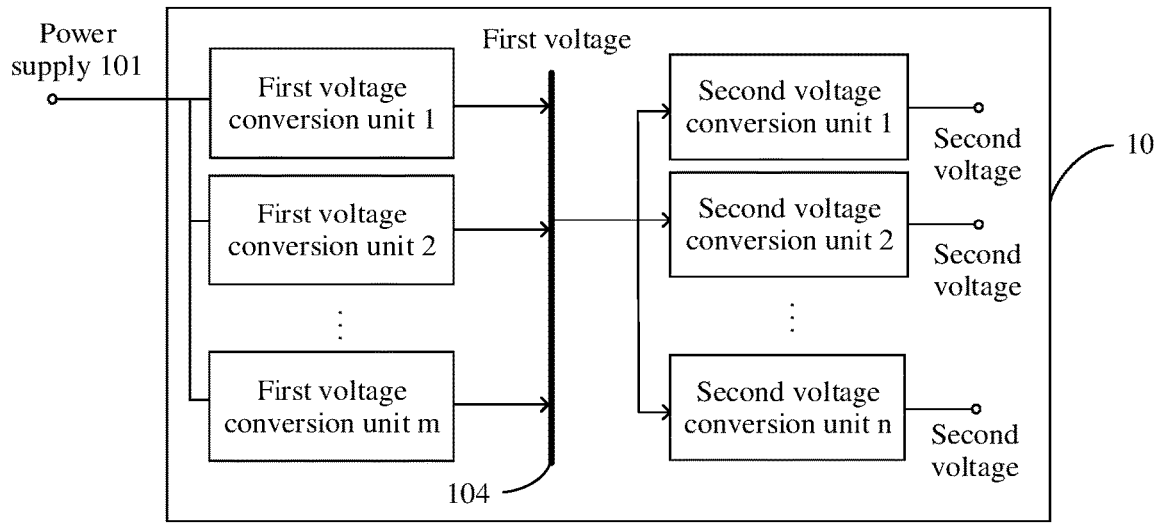
FIG. 4 is a schematic diagram 4 of a power supply system according to an embodiment.

For example, referring to FIG. 4, a power supply system 10 shown in FIG. 4 includes m first voltage conversion units, and the m first voltage conversion units are respectively a first voltage conversion unit 1, a first voltage conversion unit 2, . . . , and a first voltage conversion unit m. The m first voltage conversion units convert the voltage of the power supply 101 into m first voltages and output the m first voltages to the backplane 104. The power supply system 10 shown in FIG. 4 further includes n second voltage conversion units, and the n second voltage conversion units are respectively a second voltage conversion unit 1, a second voltage conversion unit 2, . . . , and a second voltage conversion unit n. In this case, the backplane 104 may equally provide, for the n second voltage conversion units based on a quantity of first voltage conversion units and a quantity of second voltage conversion units, the m first voltages output by the m first voltage conversion units, to equally supply power to load modules respectively connected to the n second voltage conversion units. An arrow direction shown in FIG. 3 indicates a current flow direction.

In a possible implementation, the n second voltage conversion units shown in FIG. 4 may be configured to provide a power supply voltage for n first load modules. In this case, the n second voltage conversion units are in a one-to-one correspondence with the n first load modules. In this case, even if a second voltage conversion unit supplying power to one first load module is faulty, normal operation of the other load modules is not affected.

In another possible implementation, the n second voltage conversion units shown in FIG. 4 may be configured to provide a power supply voltage for s first load modules. Herein, s is an integer less than n. In other words, in the power supply system 10, two or more second voltage conversion units may supply power to one load module. This is not limited in the embodiments.

In the two implementations, a power of a first load module is less than or equal to an output power of a second voltage conversion unit connected to the first load module.

For brief description, in this embodiment, the following provides descriptions by using an example in which the n second voltage conversion units are configured to provide a power supply voltage for the n first load modules, in other words, the n second voltage conversion units are in a one-to-one correspondence with the n first load modules.

Figure 5:
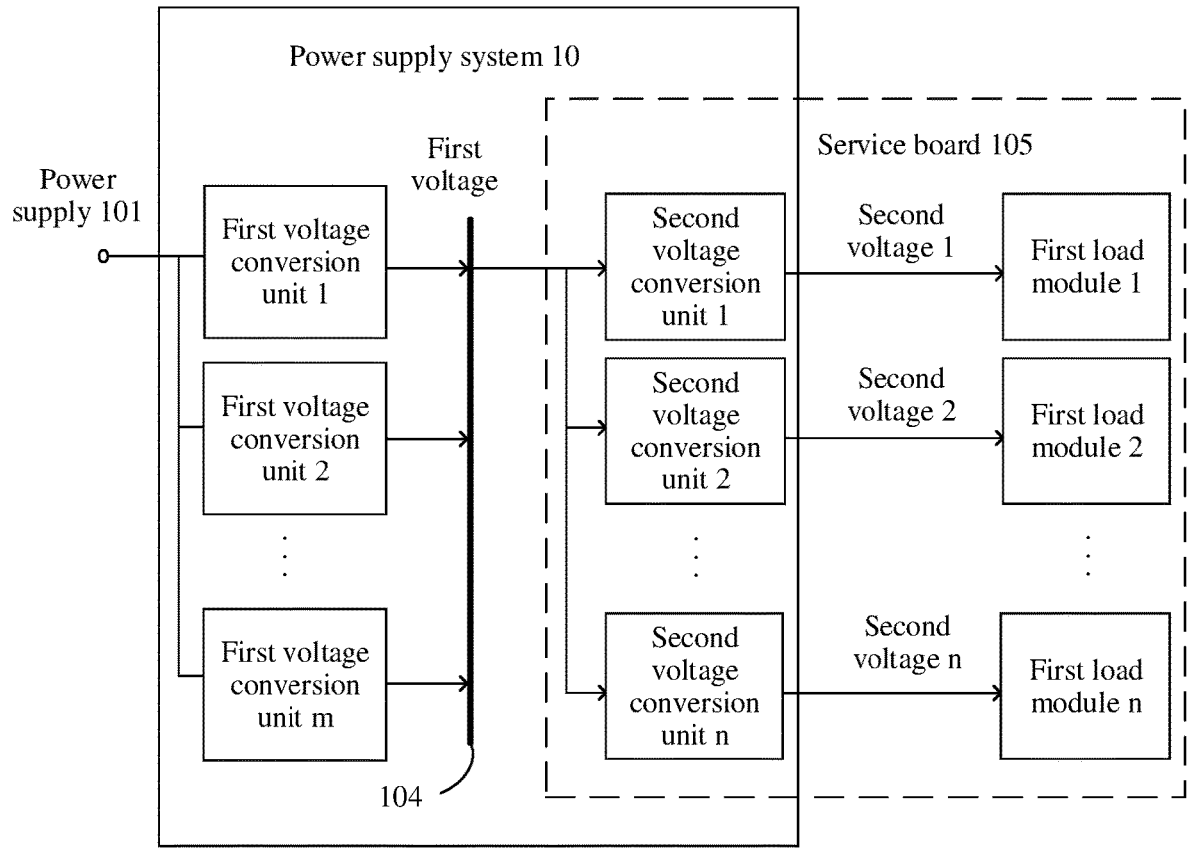
FIG. 5 is a schematic diagram 1 in which a power supply system supplies power to a service board according to an embodiment.

For example, referring to FIG. 5, description is provided by using an example in which a service board 105 includes n first load modules. As shown in FIG. 5, the service board 105 includes n first load modules, and the n first load modules are respectively a first load module 1, a first load module 2, . . . , and a first load module n. The n second voltage conversion units in the power supply system 10 may respectively provide a power supply voltage (namely, the second voltage) for the n first load modules. As shown in FIG. 5, a second voltage conversion unit 1 is connected to a first load module 1, the second voltage conversion unit 1 is configured to convert a first voltage extracted from the backplane 104 into a second voltage 1, and the second voltage 1 is a power supply voltage of the first load module 1; a second voltage conversion unit 2 is connected to a first load module 2, the second voltage conversion unit 1 is configured to convert the first voltage extracted from the backplane 104 into a second voltage 2, and the second voltage 2 is a power supply voltage of the first load module 2; a second voltage conversion unit n is connected to a first load module n, the second voltage conversion unit 1 is configured to convert the first voltage extracted from the backplane 104 into a second voltage n, and the second voltage n is a power supply voltage of the first load module n, and so on.

Figure 6:
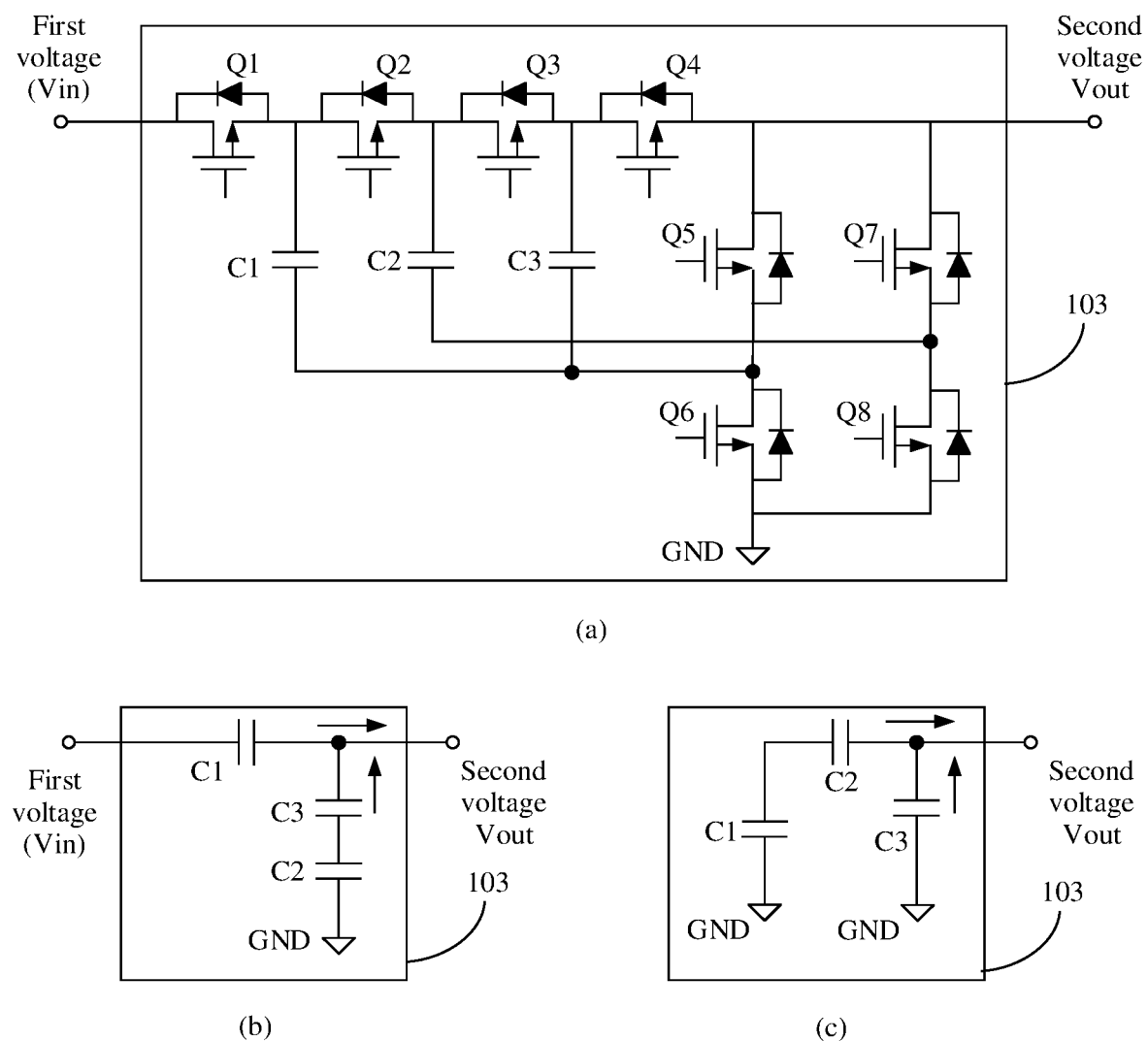
FIG. 6 is a schematic diagram of an implementation circuit of a second voltage conversion unit according to an embodiment.

In an example, FIG. 6 shows an implementation circuit of the second voltage conversion unit 103. As shown in FIG. 6, the circuit includes eight field effect transistors, and the eight field effect transistors are respectively field effect transistors Q1 to Q8. The circuit further includes three capacitors, and the three capacitors are respectively a capacitor C1 to a capacitor C3.

Q1, Q3, Q5, and Q8 may be used as one group of switching units, namely, a switching unit group 1. Q2, Q4, Q6, and Q7 are used as a second group of switching units, namely, a switching unit group 2. In an actual application, duty cycles of the switching unit group 1 and the switching unit group 2 are controlled, so that a conduction time ratio between the switching unit group 1 and the switching unit group 2 is 1:1. It should be noted that when the switching unit group 1 is conducted, the switching unit group 2 is cut off. When the switching unit group 2 is conducted, the switching unit group 1 is cut off.

In this case, when the switching unit group 1 is conducted, in other words, Q1, Q3, Q5, and Q8 are conducted, the switching unit group 2 is cut off, in other words, Q2, Q4, Q6, and Q7 are cut off. In this case, a circuit shown in (a) in FIG. 6 may be represented as a circuit shown in (b) in FIG. 6. In this case, for an output voltage (namely, the second voltage), Vo=Vc2−Vc3, and Vo=Vin−Vc1. Herein, Vin is an input voltage (namely, the first voltage). An arrow direction shown in (b) in FIG. 6 is a current flow direction.

When the switching unit group 2 is conducted, in other words, Q2, Q4, Q6, and Q7 are conducted, the switching unit group 1 is cut off, in other words, Q1, Q3, Q5, and Q8 are cut off. In this case, a circuit shown in (a) in FIG. 6 may be represented as a circuit shown in (c) in FIG. 6. In this case, for an output voltage (namely, the second voltage), Vo=Vc3, and Vo=Vc1−Vc2. In this case, a current in the circuit shown in (c) in FIG. 6 may be a discharge current of the capacitor C1, the capacitor C2, and the capacitor C3. An arrow direction shown in (c) in FIG. 6 is a current flow direction.

In this case, in an ideal state (for example, a conduction voltage of a field effect transistor is 0), when Vc3=Vo, Vc2=Vo+Vc3, in other words, Vc2=Vo+Vo=2Vo. Further, Vc1=Vo+Vc2. In other words, Vc1=Vo+2Vo=3Vo. Further, Vin=Vo+Vc1. In other words, Vin=Vo+3Vo=4Vo. In other words, the implementation circuit of the second voltage conversion unit 103 shown in FIG. 6 implements a voltage step-down output of 4:1.

Therefore, compared with a conventional technology, in the solution provided in this embodiment, the second voltage conversion unit 103 is used to supply power to the load module on the service board, to improve voltage conversion efficiency to 98.5%.

The second voltage conversion unit 103 deployed on the service board may be referred to as an on-board power supply in the power supply system 10.

The power supply system 10 supplies power to the at least one load module on the at least one service board in the ICT device. Because a non-isolated voltage conversion circuit is used for the on-board power supply in the power supply system 10, compared with the conventional technology in which an isolated voltage conversion circuit is used for the on-board power supply (namely, a voltage conversion unit deployed on a service board in the conventional technology), in the solution provided in this embodiment, voltage conversion efficiency can be effectively improved, to improve efficiency of supplying power to the load module by the power supply.

Figure 7:
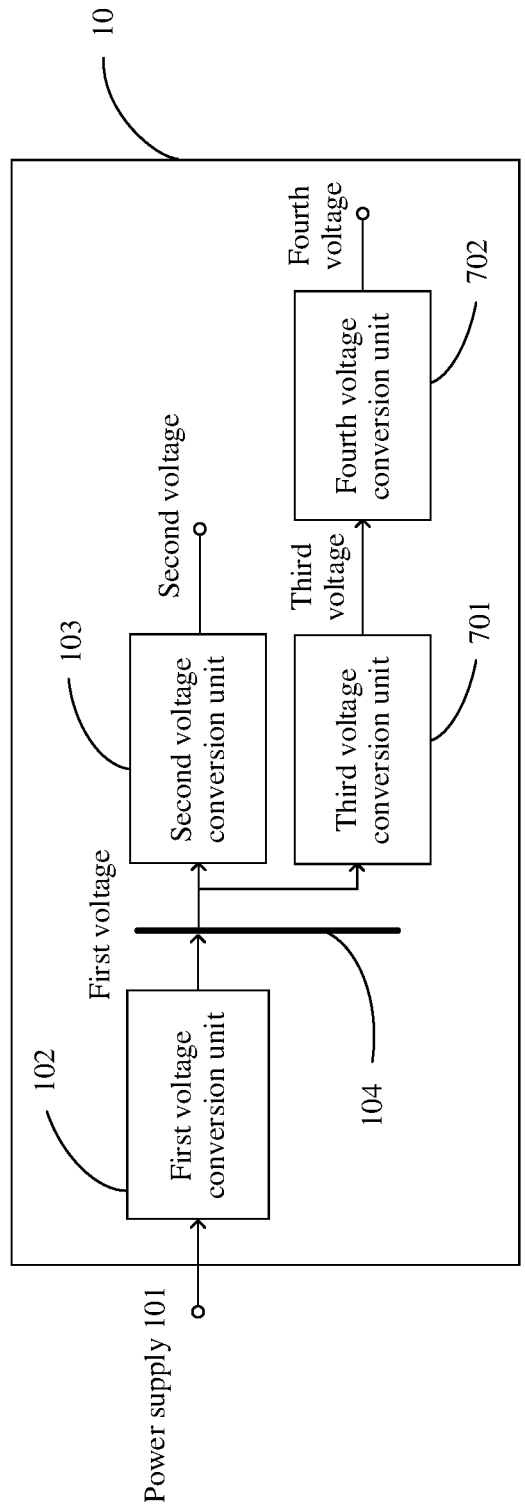
FIG. 7 is a schematic diagram 5 of a power supply system according to an embodiment.

Optionally, in some other embodiments, the power supply system 10 provided in this embodiment may further includes a third voltage conversion unit and a fourth voltage conversion unit. With reference to FIG. 1 and FIG. 7, the power supply system 10 shown in FIG. 7 further includes a third voltage conversion unit 701 and a fourth voltage conversion unit 702. The third voltage conversion unit 701 and the fourth voltage conversion unit 702 may jointly serve as an on-board power supply in the power supply system 10 and are configured to supply power to the load module on the service board.

In an example, the third voltage conversion unit 701 and the fourth voltage conversion unit 702 may jointly serve as an on-board power supply in the power supply system 10 and are configured to supply power to a second load module. The second load module is any load module on the service board. Optionally, a power of the second load module is less than or equal to a preset threshold. A value of the preset threshold is not limited in this embodiment.

For example, the second load module may be a low-power load on the service board.

The third voltage conversion unit 701 may be connected to the first voltage conversion unit 102 by using the backplane 104 and may be configured to convert, into a third voltage, the first voltage output by the first voltage conversion unit 102. Herein, the third voltage may be used as an intermediate bus voltage on the service board. In an example, the third voltage may usually be a commonly used voltage of 12 V.

Optionally, the third voltage is usually less than the first voltage. In other words, the third voltage conversion unit 701 is a circuit unit for voltage step-down.

The third voltage conversion unit 701 may be a non-isolated voltage conversion unit. For another description of the third voltage conversion unit 701, refer to the description of the second voltage conversion unit 103. Details are not described herein again.

The third voltage conversion unit 701 may also be a conventional isolated intermediate bus converter (IBC). Details are not described herein again.

The fourth voltage conversion unit 702 is connected to the third voltage conversion unit 701, and is configured to convert, into a fourth voltage, the third voltage output by the third voltage conversion unit 701. Herein, the fourth voltage is a power supply voltage of the load module (for example, the second load module).

Optionally, the fourth voltage is usually less than the third voltage. In other words, the fourth voltage conversion unit 702 is a circuit unit for voltage step-down.

In this embodiment, the fourth voltage conversion unit 702 may be a non-isolated point-of-load (POL) voltage conversion unit. Details are not described again.

The third voltage output by the third voltage conversion unit 701 may be used as an input voltage of at least one fourth voltage conversion unit 702 and may be used to supply power to at least one second load module. The at least one fourth voltage conversion unit 702 is in a one-to-one correspondence with the at least one second load module. An output power of the third voltage conversion unit 701 is greater than or equal to a power sum of the at least one second load module.

Figure 8:
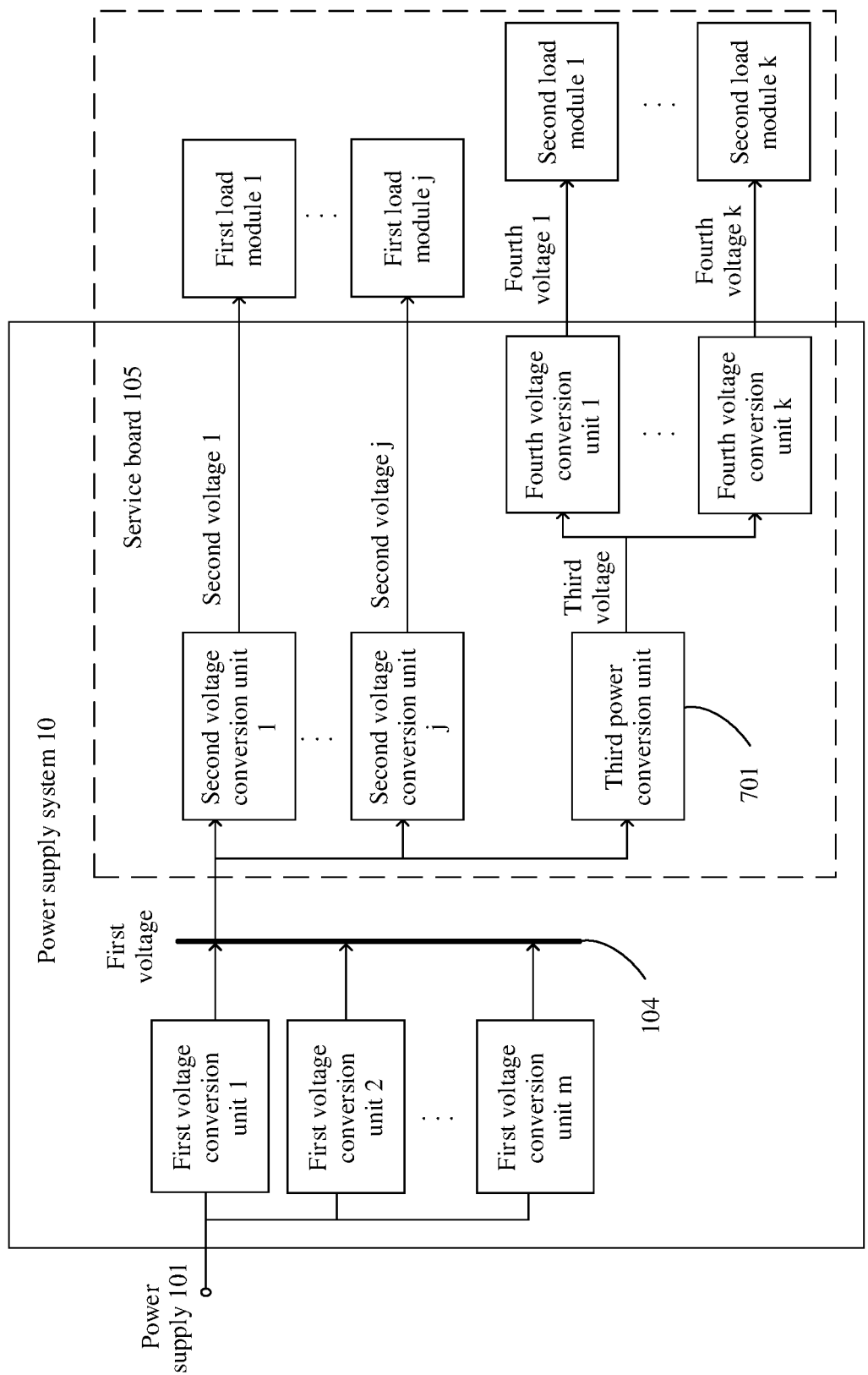
FIG. 8 is a schematic diagram 2 in which a power supply system supplies power to a service board according to an embodiment.

As shown in FIG. 8, that the service board 105 includes n load modules is used as an example. The n load modules include j first load modules and k second load modules, where j and k each are a positive integer, and n=k+j. The j first load modules include a first load module 1, ..., and a first load module j. The k second load modules include a second load module 1, ..., and a second load module k.

As shown in FIG. 8, j second voltage conversion units are respectively connected to the j first load modules, and respectively supply power to the j first load modules. For descriptions in which the j second voltage conversion units respectively supply power to the j first load modules, refer to descriptions in FIG. 5. Details are not described herein again.

As shown in FIG. 8, the third voltage conversion unit 701 is connected to the backplane, and converts, into the third voltage, the first voltage output by the first voltage conversion unit 102. The third voltage conversion unit 701 is further connected to k fourth voltage conversion units, the k fourth voltage conversion units respectively convert, into k fourth voltages, the third voltage output by the third voltage conversion unit 701, and the k fourth voltages are power supply voltages of the k second load modules. The k fourth voltage conversion units include a fourth voltage conversion unit 1, ..., and a fourth voltage conversion unit k. As shown in FIG. 8, the fourth voltage conversion unit 1 is configured to convert, into a fourth voltage 1, a third voltage output by the third voltage conversion unit 701, and the fourth voltage 1 is a power supply voltage of the second load module 1. The fourth voltage conversion unit k converts, into a fourth voltage k, a third voltage output by the third voltage conversion unit 701, and the fourth voltage k is a power supply voltage of the second load module k.

In the power supply system 10 shown in FIG. 8, a power sum of the k second load modules may be less than or equal to the output power of the third voltage conversion unit 701. If the power sum of the k second load modules is greater than the output power of the third voltage conversion unit 701, a quantity of third voltage conversion units 701 may be increased, to supply power to the k second load modules.

Figure 9:
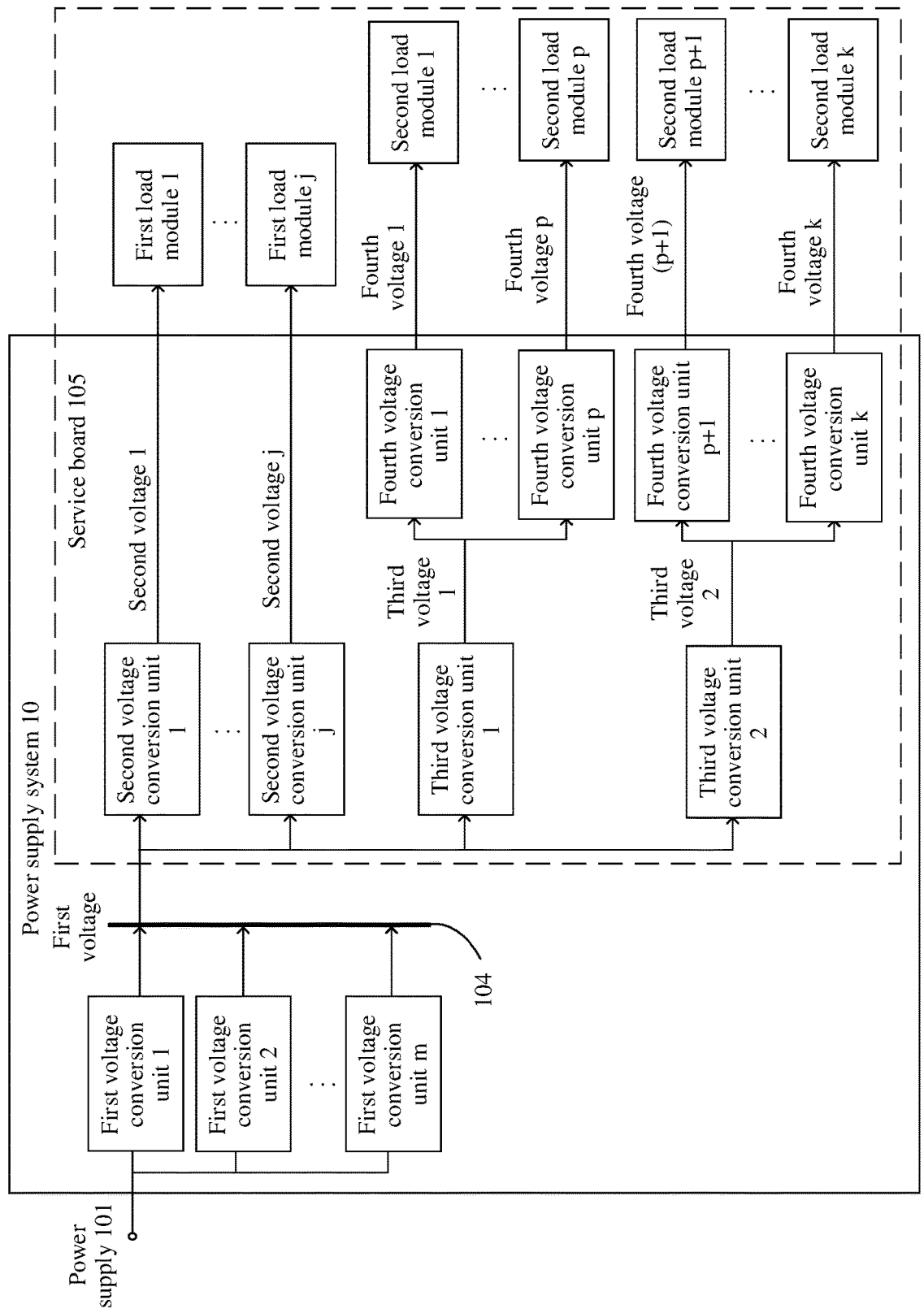
FIG. 9 is a schematic diagram 3 in which a power supply system supplies power to a service board according to an embodiment.

A power supply system 10 shown in FIG. 9 includes two third voltage conversion units, and the two third voltage conversion units are respectively a third voltage conversion unit 1 and a third power conversion unit 2. The power supply system 10 further includes k fourth voltage conversion units and k second load modules.

The third voltage conversion unit 1 is connected to p fourth voltage conversion units, and output voltages of the p fourth voltage conversion units are power supply voltages of p second load modules, where p is a positive integer, and p is less than k. Herein, an output power of the third voltage conversion unit 1 is greater than or equal to a power sum of the p second load modules. As shown in FIG. 9, the p fourth voltage conversion units include a fourth voltage conversion unit 1, ..., and a fourth voltage conversion unit p. The p second load modules include a second load module 1, ..., and a second load module p. The fourth voltage conversion unit 1 is configured to convert, into a fourth voltage 1, a third voltage output by the third voltage conversion unit 1, and the fourth voltage 1 is a power supply voltage of the second load module 1. The fourth voltage conversion unit p is configured to convert, into a fourth voltage p, the third voltage output by the third voltage conversion unit 1, and the fourth voltage p is a power supply voltage of the second load module p.

A third voltage conversion unit 2 is connected to (k−p) fourth voltage conversion units, and supplies power to (k−p) second load modules. Herein, an output power of the third voltage conversion unit 2 is greater than or equal to a power sum of the (k−p) second load modules. As shown in FIG. 9, the (k−p) fourth voltage conversion units include a fourth voltage conversion unit (p+1), ..., and a fourth voltage conversion unit k. The (k−p) second load modules include a second load module (p+1), ..., and a second load module k. The fourth voltage conversion unit (p+1) is configured to convert, into a fourth voltage (p+1), a third voltage output by the third voltage conversion unit 2, and the fourth voltage (p+1) is a power supply voltage of the second load module (p+1). The fourth voltage conversion unit k is configured to convert, into a fourth voltage k, the third voltage output by the third voltage conversion unit 1, and the fourth voltage k is a power supply voltage of the second load module k.

Therefore, an on-board power supply of a two-stage conversion type including the third voltage conversion unit and the fourth voltage conversion unit supplies power to a load module, to reduce a voltage difference between an input voltage and an output voltage of the third voltage conversion unit and reduce a voltage difference of the fourth voltage conversion unit. Therefore, a requirement for a parameter of a circuit element in the on-board power supply can be reduced, and costs (if the requirement for the parameter of the circuit element is high, production costs are high) are reduced. The parameter of the circuit element may be, for example, an input voltage, an output voltage, or the like of the circuit element.

Figure 10:
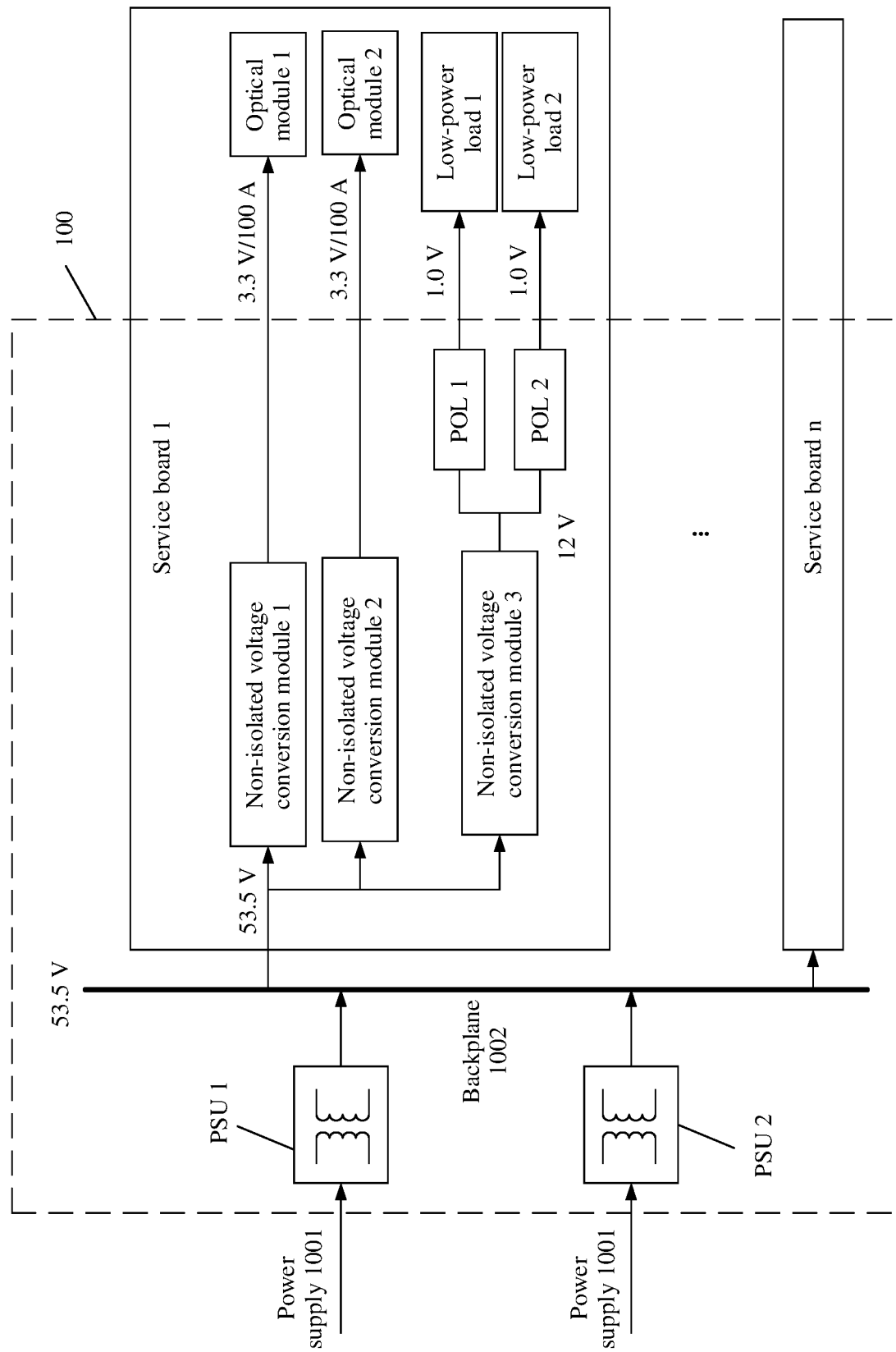
FIG. 10 is a schematic diagram in which a power supply system supplies power to a service board in an actual application according to an embodiment.

In an example, FIG. 10 is a schematic diagram in which the power supply system supplies power to load modules on n service boards in an actual application. As shown in FIG. 10, the n service boards include a service board 1, ..., and a service board n.

As shown in FIG. 10, a power supply system 100 is externally connected to a power supply 1001. For the power supply 1001, refer to the description of the power supply 101. Details are not described herein again.

As shown in FIG. 10, the power supply system 100 includes two first voltage conversion units, namely, a PSU 1 and a PSU 2, and the PSU 1 and the PSU 2 each implement isolated voltage conversion by using a transformer. The PSU 1 and the PSU 2 each are configured to: convert an input power supply of the power supply into a common voltage of 53.5 V (namely, the first voltage described above), and transmit the voltage to a backplane 1002.

The following provides descriptions by using an example in which the power supply system 100 supplies power to four load modules on a service board 1. Herein, the four load modules include an optical module 1, an optical module 2, a low-power load 1, and a low-power load 2.

As shown in FIG. 10, the power supply system 100 may further include two second voltage conversion units, namely, a non-isolated voltage conversion module 1 and a non-isolated voltage conversion module 2. The non-isolated voltage conversion module 1 is connected to the backplane 1002 and is configured to convert the voltage of 53.5 V on the backplane into a power supply voltage 3.3 V of the optical module 1. Similarly, the non-isolated voltage conversion module 2 is connected to the backplane 1002 and is configured to convert the voltage of 53.5 V on the backplane into a power supply voltage 3.3 V of the optical module 2.

On-board power supplies of the optical module 1 and the optical module 2 may include only one-stage voltage conversion. Powers of the optical module 1 and the optical module 2 each are 3.3×100, namely, 330 W.

As shown in FIG. 10, the power supply system 100 further includes one third voltage conversion unit, namely, a non-isolated voltage conversion module 3. The power supply system 100 further includes two fourth voltage conversion units, namely, a POL 1 and a POL 2. The non-isolated voltage conversion module 3 is connected to the backplane 1002, and is configured to convert the voltage of 53.5 V on the backplane into a common voltage of 12 V. Then, the POL 1 is connected to the non-isolated voltage conversion module 3 and is configured to convert the voltage of 12 V output by the non-isolated voltage conversion module 3 into a power supply voltage 1.0 V of the low-power load 1. Similarly, the POL 2 is connected to the non-isolated voltage conversion module 3 and is configured to convert the voltage of 12 V output by the non-isolated voltage conversion module 3 into a power supply voltage 1.0 V of the low-power load 2.

For a low-power load, two-stage voltage conversion may be performed for the on-board power supply of the power supply system 100. In this case, based on such a power supply solution, not only power supply conversion efficiency is improved, but also costs of a component in the power supply system 100 are reduced.

The non-isolated voltage conversion module 3 shown in FIG. 10 may be a voltage conversion unit implemented by the circuit shown in FIG. 6 or may be a conventional isolated IBC. This is not limited.

In addition, an on-board power supply including a second voltage conversion unit or an on-board power supply including a third voltage conversion unit and a fourth voltage conversion unit is a non-isolated voltage conversion circuit. Therefore, the on-board power supply in the power supply system in this embodiment is characterized by a small size and a low height.

For example, in an actual application, the second voltage conversion unit serves as an on-board power supply. Compared with a conventional on-board power supply, in this embodiment, the size is reduced by 50%. Therefore, a small-size on-board power supply can be used to increase a capacity of the service board. In addition, because an implementation circuit of the second voltage conversion unit may have an ultra-thin design less than 4 mm, a whole-board heat sink may be used to dissipate heat for the on-board power supply (namely, the second voltage conversion unit) and the load module on the service board, to improve heat dissipation efficiency of the service board.

Similarly, an implementation circuit of the on-board power supply including the third voltage conversion unit and the fourth voltage conversion unit is characterized by a small size. Therefore, the capacity of the service board can be improved. In addition, because the implementation circuit may also have an ultra-thin design less than 4 mm, a whole-board heat sink may be used to dissipate heat for the on-board power supply (including the third voltage conversion unit and the fourth voltage conversion unit) and the load module on the service board, to improve heat dissipation efficiency of the service board.

Optionally, because the whole-board heat sink is used to dissipate heat for the on-board power supply and the load module on the service board, a distance between the on-board power supply and the load module in the power supply system provided in this embodiment is less than a distance that is between an on-board power supply and a load module and that exists when a discrete heat dissipation solution is used for the on-board power supply and the load module in the conventional technology. Therefore, a shorter distance between the on-board power supply and the load module can lead to a lower line loss between the on-board power supply and the load module, to further improve efficiency of supplying power to the load module by the power supply.

The following describes heat dissipation of the on-board power supply as an example by using an example in which the on-board power supply is the second voltage conversion unit and the load module is the first load module.

Figure 11:
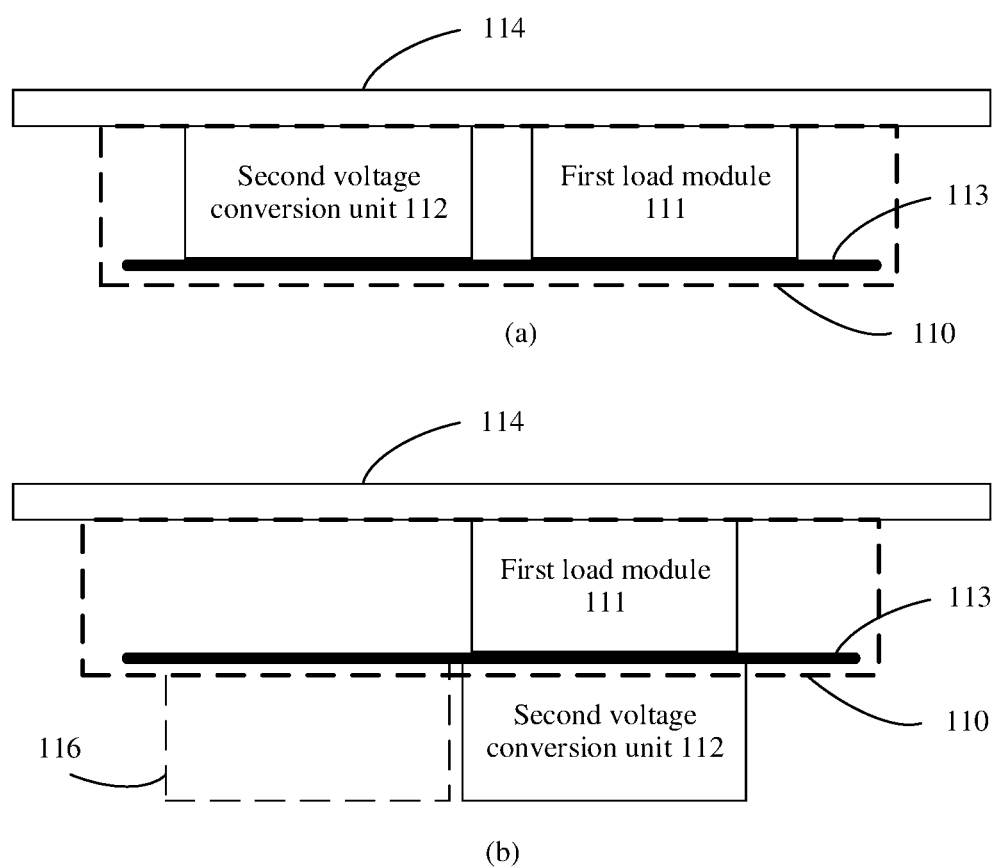
FIG. 11 is a schematic diagram of heat dissipation of an on-board power supply and a load module according to an embodiment.

In an example, FIG. 11 is a schematic diagram in which whole-board heat dissipation is performed for a first load module 111 and a second voltage conversion unit 112. A service board 110 may include the first load module 111, the second voltage conversion unit 112, and a printed circuit board (PCB) 113. As shown in (a) in FIG. 11, both the first load module 111 and the second voltage conversion unit 112 are disposed on a front face of the PCB board 113. In this case, the heat sink 114 may be disposed on a side that is of the first load module 111 and the second voltage conversion unit 112 and that is away from the PCB board 113, to simultaneously dissipate heat for the first load module 111 and the second voltage conversion unit 112.

Optionally, because the second voltage conversion unit has a small size and a low height, the second voltage conversion unit may alternatively be disposed on a rear face of the PCB board. In this case, a capacity of the service board can be increased. In addition, when the second voltage conversion unit and the first load module are symmetrical to the PCB board, a distance between the second voltage conversion unit and the first load module can be further reduced, to reduce a line loss between the second voltage conversion unit and the first load module, and further improve efficiency of supplying power to a load module by a power supply.

In an example, as shown in (b) in FIG. 11, the first load module 111 is disposed on the front face of the PCB board 113, and the second voltage conversion unit 112 is disposed on the rear face of the PCB board 113. In addition, the first load module 111 and the second voltage conversion unit 112 are symmetrical to the PCB board 113. The second voltage conversion unit 112 may also be shifted to a location that is symmetrical to the first load module 111 with respect to the PCB board 113 that is used as a symmetrical surface. For example, the second voltage conversion unit 112 may be disposed at a location shown by a dashed line box 116 in (b) in FIG. 11. This is not limited.

A heat dissipation manner and a disposing manner of the on-board power supply (namely, the second voltage conversion unit 112) shown in FIG. 11 may also be applicable to a scenario in which the on-board power supply of the service board includes a third voltage conversion unit and a fourth voltage conversion unit. Details are not described herein again.

An embodiment may provide a power supply system. In the power supply system, a non-isolated voltage conversion unit is used for each on-board power supply on the service board, to improve voltage conversion efficiency of the on-board power supply. Because the circuit of the on-board power supply has a low height, whole-board heat dissipation may be performed for the on-board power supply and the load module on the service board, to improve heat dissipation efficiency of the service board.

Further, because whole-board heat dissipation may be performed for the on-board power supply and the load module, a distance between the load module and the on-board power supply may be shorter, to reduce a line loss between the load module and the on-board power supply, and further improve efficiency of supplying power to the load module by the power supply.

An embodiment may further provide an ICT device. The power supply systems shown in FIG. 1 to FIG. 10 may supply power to a load module on a service board in the ICT device.

The power supply systems provided in the embodiments may supply power to all or some load modules on the service board in the ICT device. This is not limited in the embodiments.

The foregoing descriptions are merely implementations, but are not intended to limit the scope of the embodiments. Any variation or replacement readily figured out by a person skilled in the art shall fall within the scope of the embodiments.

What is claimed is:

1. A power supply system, comprising:
   a first voltage conversion unit, wherein the first voltage conversion unit is an isolated voltage conversion unit, the first voltage conversion unit is connected to a power supply, and is configured to convert a voltage of the power supply into a first voltage, and the first voltage is a power supply voltage of a service board; and
   a second voltage conversion unit, wherein the second voltage conversion unit is a non-isolated voltage conversion unit and is configured to convert the first voltage into a second voltage, the second voltage conversion unit is deployed on the service board, and the second voltage is a power supply voltage of a first load module on the service board.

2. The power supply system according to claim 1, wherein the second voltage conversion unit comprises a field effect transistor and a capacitor.

3. The power supply system according to claim 1, wherein the first voltage is greater than 12 V.

4. The power supply system according to claim 1, wherein the first load module comprises an optical module.

5. The power supply system according to claim 1, further comprising:
   a third voltage conversion unit, wherein the third voltage conversion unit is a non-isolated voltage conversion unit is configured to convert the first voltage into a third voltage, and the third voltage conversion unit is deployed on the service board; and
   a fourth voltage conversion unit, wherein the fourth voltage conversion unit is a non-isolated voltage conversion unit and is configured to convert the third voltage into a fourth voltage, the fourth voltage conversion unit is deployed on the service board, and the fourth voltage is a power supply voltage of a second load module on the service board.

6. The power supply system according to claim 5, wherein a power of the second load module is less than or equal to a preset threshold.

7. The power supply system according to claim 5, wherein the second load module comprises a low-power load.

8. The power supply system according to claim 1, wherein a whole-board heat sink is configured to dissipates heat of the second voltage conversion unit and the first load module and configured to cover the second voltage conversion unit and the first load module.

9. The power supply system according to claim 1, wherein a value range of the first voltage comprises 24 V to 60 V.

10. The power supply system according to claim 1, wherein a value of the first voltage is 48 V or 53.5 V.

11. An ICT device comprising: a power supply system configured to supply power to a service board in the ICT device, and the power supply system comprises:
   a first voltage conversion unit, wherein the first voltage conversion unit is an isolated voltage conversion unit, the first voltage conversion unit is connected to a power supply, and is configured to convert a voltage of the power supply into a first voltage, and the first voltage is a power supply voltage of a service board; and
   a second voltage conversion unit, wherein the second voltage conversion unit is a non-isolated voltage conversion unity and is configured to convert the first voltage into a second voltage, the second voltage conversion unit is deployed on the service board, and the second voltage is a power supply voltage of a first load module on the service board.

* * * * *